United States Patent
Shah

(10) Patent No.: US 6,900,477 B1
(45) Date of Patent: May 31, 2005

(54) PROCESSING TECHNIQUE TO IMPROVE THE TURN-OFF GAIN OF A SILICON CARBIDE GATE TURN-OFF THYRISTOR AND AN ARTICLE OF MANUFACTURE

(75) Inventor: Pankaj B. Shah, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/310,905

(22) Filed: Dec. 6, 2002

Related U.S. Application Data
(60) Provisional application No. 60/336,720, filed on Dec. 7, 2001.

(51) Int. Cl.[7] .................. H01L 29/74; H01L 31/111
(52) U.S. Cl. ............................... 257/107; 257/147
(58) Field of Search ................. 257/76, 77, 107, 257/119, 147, 153

(56) References Cited

U.S. PATENT DOCUMENTS

| | | | |
|---|---|---|---|
| 5,491,351 A | 2/1996 | Bauer et al. | |
| 5,539,217 A | 7/1996 | Edmond et al. | |
| 5,703,383 A | 12/1997 | Nakayama | |
| 5,814,546 A | 9/1998 | Hermansson | |
| 5,831,289 A | 11/1998 | Agarwal | |
| 6,002,143 A | 12/1999 | Terasawa | |
| 6,259,134 B1 | 7/2001 | Amaratunga et al. | |

OTHER PUBLICATIONS

Agarwal, et al., 700–V Asymmetrical 4H–SiC Gate Turn–Off Thyristors (GTO's), IEEE Electron Device Letters, 1997, 18(11), 518–520.

Cao, et al., Characterization of 4H–SiC Gate Turn–off Thyristor, Solid–State Electronics, 2000, 44, 347–352.

Li, et al., High Current Density 800–V 4H–SiC Gate Turn–off Thyristors, IEEE Electron Device Letters, 1999, 20(5), 219–222.

Agarwal, et al., Turn–off performance of 2.6 kV 4H–SiC asymmetrical GTO thyristor, Semiconductor Science and Technology, 2001, 16, 260–262.

Azuma, et al., GTO Thyristors, Proceedings of the IEEE, 1988, 76(4), 419–427.

Shah, et al., In–depth analysis of SiC GTO Thyristor performance using numerical simulations, Solid–State Electronics, 2000, 44, 353–358.

Siergiej, et al., Advances in SiC materials and devices: an Industrial point of view, Materials Science & Engineering B., 1999, 61–62, 9–17.

(Continued)

*Primary Examiner*—David Zarneke
*Assistant Examiner*—Scott B. Geyer
(74) *Attorney, Agent, or Firm*—William V. Adams

(57) ABSTRACT

A structure and method for a silicon carbide (SiC) gate turn-off (GTO) thyristor device operable to provide an increased turn-off gain comprises a cathode region, a drift region having an upper portion and a lower portion, wherein the drift region overlies the cathode region, a gate region overlying the drift region, an anode region overlying the gate, and at least one ohmic contact positioned on each of the gate region, anode region, and cathode region, wherein the upper portion of the drift region, the gate region, and the anode region have a free carrier lifetime and mobility lower than a comparable SiC GTO thyristor for providing the device with an increased turn-off gain, wherein the free carrier lifetime is approximately 10 nanoseconds. The reduced free carrier lifetime and mobility are affected by altering the growth conditions, such as temperature under which epitaxy occurs.

6 Claims, 6 Drawing Sheets

OTHER PUBLICATIONS

Shah, 4H–silicon carbide modified–anode gate turn–off thyristor, Electronics Letters, 2000, 36(7), 671–672.

Xie, et al., A High–Current and High–Temperature 6H–SiC Thyristor, IEEE Electron Device Letters, 1996, 17(3), 142–144.

Shah, et al., Two–dimensional numerical investigation of the impact of material–parameter uncertainty on the steady–state performance of passivated 4H–SiC thyristors, Journal of Applied Physics, 1998, 84(8), 4625–4630.

Casady, et al., 4H–SiC Power Devices For Use In Power Electronic Motor Control, Solid–State Electronics, 1998, 42(12), 2165–2176.

Shah, Silicon Carbide Distributed Buffer Gate Turn–off Thyristor Structure for Blocking High Voltages, Electronic Letters, 2000, 36(25), 2108–2109.

Shah, et al., Advanced Operational Techniques and pn–pn–pn Structures for High–Power Silicon Carbide Gate Turn–off Thyristors, Sensors and Electron Devices Directorate, U.S. Army Research Laboratory, AMSRL–SE–RL, Adelphi, MD, 1232–1236.

PROCESSING TECHNIQUE TO IMPROVE THE TURN-OFF GAIN OF A SILICON CARBIDE GATE TURN-OFF THYRISTOR AND AN ARTICLE OF MANUFACTURE

CROSS-REFERENCE TO RELATED APPLICATION

This application claims the benefit of U.S. Provisional Patent Application No. 60/336,720 filed Dec. 7, 2001.

GOVERNMENT INTEREST

The invention described herein may be manufactured, used and/or licensed by or for the United States Government.

BACKGROUND OF THE INVENTION

1. Field of the Invention

The present invention generally relates to semiconductor electronic switches, and more particularly to high power, high temperature gate-assisted turn-off thyristor devices, and methods of manufacturing the same.

2. Description of the Related Art

Thyristors are bistable power semiconductor devices that can be switched from an off-state to an on-state, or vice versa. Thyristors, along with other power semiconductor devices such as high-power bipolar junction transistors and power metal oxide semiconductor field effect transistors control or pass large amounts of current and block high voltages. Unlike conventional thyristors, a gate turn-off (GTO) thyristor is turned off by a reverse gate pulse. Generally, a trigger input implements conduction in GTO thyristors. Thereafter, the GTO thyristors behave as diodes.

A thyristor is a very rugged device in terms of transient currents, di/dt, and dv/dt capability. The forward voltage ($V_f$) drop in conventional silicon thyristors is approximately 1.5 V to 2 V, and for some higher power devices, it is approximately 3 V. Therefore, a thyristor can control or pass large amounts of current and effectively block high voltages (i.e., a voltage switch). Although $V_f$ determines the on-state power loss of the device at any given current, the switching power loss becomes a dominating factor affecting the device function temperature at high operating frequencies. Because of this, the maximum switching frequencies attainable using conventional thyristors are limited, as compared with many other types of power devices.

Two important parameters for a thyristor are the built-in potential (which is a characteristic of any semiconductor material's bandgap) and the specific on-resistance (which is the resistance of the device in the linear region when the device is turned on). Preferably,, the specific on-resistance for a thyristor should be as small as possible so as to maximize the current per unit area for a given voltage applied to the thyristor. In particular, the lower the specific on-resistance, the lower the $V_f$ drop is for a given current rating. Moreover, the minimum $V_f$ for a given semiconductor material is its built-in potential (voltage).

Conventional thyristors may be made of silicon, for example, such as a silicon-controlled rectifier. However, thyristors made of silicon have certain performance limitations inherent in the silicon material itself, such as the thickness of the drift region. The largest contributory factor to specific on-resistance is the resistance of the thick low-doped drift region of the thyristor. Typically, as the rated voltage of a thyristor increases, the thickness of the drift region increases and the doping of the drift region decreases. Thus, the resistance of the drift region increases dramatically. Therefore, the thickness of the drift region should be minimized and the level of doping should be maximized, for any given rated voltage so as to minimize the specific on-resistance for the device.

Several thyristor structures have been developed in an attempt to solve the on-resistance problems described above. These conventional devices include variations of the silicon material to try to lower the on-resistance. However, the conventional devices are limited by the inherent characteristics of the silicon semiconductor material itself. The electrostatic breakdown field is lower in silicon than it is in silicon carbide. This, in turn, requires that these portions be physically thicker, which makes for a generally disadvantageous specific resistance.

Silicon carbide offers a number of advantageously unique physical and electronic properties, which makes it particularly useful for thyristors. This includes its high melting point, high thermal conductivity, radiation hardness (particularly to neutron radiation), wide bandgap, high breakdown electric field, and high saturated electron drift velocity. With the high breakdown field, thinner devices can be developed that block a given amount of voltage compared to silicon devices. This provides faster switching devices because a smaller volume of charge carrier must be removed during turn-off. Therefore, the power handling capability of silicon carbide GTO thyristors is much better than that of silicon GTO thyristors. Additionally, silicon carbide is physically rugged and chemically inert.

Because of the superior physical and chemical properties of silicon carbide, several applications for silicon carbide GTO thyristors exist including high voltage DC systems, traction circuits, motor control, power factor control, and other power conditioning circuits. Moreover, these systems may be found in electric or hybrid electric vehicles, including tanks and helicopters. However, one major limitations to the use of conventional silicon carbide GTO thyristors in these systems is the low turn-off gain. Turn-off gain is the ratio of the cathode current being switched off by the GTO thyristor divided by the maximum gate current required for the switching process. If the turn-off gain is low, then the switching losses will be high, thereby reducing the amount of power that a single silicon carbide GTO thyristor can handle. Also, the circuit providing the gate drive current to turn off the GTO thyristor requires extremely robust devices, which increases the cost and complexity of the overall system.

Conventional devices have achieved turn-off gains of 12.5 with a drift region thickness of 50 micrometers. However, as silicon carbide growth techniques improve, the thickened epilayers (epitaxially grown layers) will become less rough, and with this material quality improvement comes longer free carrier lifetimes and higher mobilities. This results in a disadvantageous lower turn-off gain.

Therefore, there remains a need for further development of silicon carbide GTO thyristors to overcome the deficiencies of the conventional devices. This includes increasing the turn-off gain and the maximum voltage blocked, and reducing the on-state resistance, among other needs.

SUMMARY OF THE INVENTION

In view of the foregoing, an embodiment of the invention provides a structure and method for a silicon carbide gate turn-off thyristor device operable to provide an increased turn-off gain, wherein the device comprises a cathode region, a drift region positioned over the cathode region, a gate region positioned over the drift region, an anode region positioned over the gate region, and at least one contact positioned adjacent each of the gate region, anode region, and cathode region, wherein the anode region, the gate region, and the drift region comprise an upper region of the device, and wherein the upper region has a reduced free carrier lifetime and mobility than a comparable SiC GTO thyristor for providing the device with an increased turn-off gain, wherein the reduced free carrier lifetime is approximately 10 nanoseconds. Moreover, the reduced mobility comprises a reduced electron mobility and a reduced hole mobility, wherein the reduced electron mobility is approximately 25 $cm^2/V/s$, and the reduced hole mobility is approximately 20 $cm^2/V/s$.

Alternatively, an embodiment of the invention provides a structure and method for a silicon carbide gate turn-off thyristor device operable to provide an increased turn-off gain comprises a cathode region, a drift region having an upper portion and a lower portion, wherein the drift region overlies the cathode region, a gate region overlying the drift region, an anode region overlying the gate region, and at least on ohmic contact positioned on each of the gate region, anode region, and cathode region, wherein the upper portion of the drift region, the gate region, and the anode region have a free carrier lifetime and mobility lower than a comparable SiC GTO thyristor for providing the device with an increased turn-off gain, wherein the reduced free carrier lifetime and mobility are affected by altering the growth conditions, such as temperature under which epitaxy occurs.

Additionally, an embodiment of the invention provides a method of increasing turn-off gain in a silicon carbide gate turn-off thyristor device having a cathode region, a drift region over the cathode region, a gate region over the drift region, and an anode region over the gate region, wherein the method comprises reducing free carrier lifetimes and electron and hole mobilities in a region adjacent to the junction of the gate region and drift region.

The method of the invention offers several embodiments for the manner of reducing the free carrier lifetimes and electron and hole mobilities including introducing implant impurities into the regions adjacent a junction of the gate region and the drift region; creating lattice damages in the device; introducing high energy particles in the regions adjacent a junction of the gate region and the drift region; conducting a chemical vapor deposition growth in the regions adjacent a junction of the gate region and the drift region, wherein the growth occurs at temperatures below approximately 1600° C.; growing the regions adjacent a junction of the gate region and the drift region at an angle to the drift region, wherein the step of growing is conducted at temperatures below approximately 1300° C., and wherein the angle is at least approximately one degree below a predetermined growth angle used in a comparable growth process; growing the regions adjacent a junction of the gate region and the drift region in a horizontal hot-wall reactor at temperatures below approximately 1500° C.; contaminating the regions adjacent a junction of the gate region and the drift region by removing the device from a horizontal hot-wall reactor prior to achieving full growth of the drift region, and then placing the device in the reactor to complete the full growth of the drift region; implanting the gate region with n-type dopants and the anode region with p-type dopants, and leaving the gate region and the anode region in an unannealed state; forming the regions adjacent a junction of the gate region and the drift region with a semiconductor material having a lattice constant different than the lattice constant of regions of the drift region not adjacent the junction; introducing defects in the region adjacent a junction of the gate region and the drift region by conducting a pulse doping process during growth of the gate region and the drift region, wherein the pulse doping comprises periodically changing a concentration of dopant gas in the pulse doping process.

Other embodiments for the manner of reducing the free carrier lifetimes and electron and hole mobilities include using a first type of dopant in the region adjacent a junction of the gate region and the drift region and using a second type of dopant in remaining parts of the device; growing the region adjacent a junction of the gate region and the drift region under nonoptimum growth conditions for a vapor phase epitaxy process, wherein the nonoptimum growth conditions comprise any of low growth temperatures, low growth pressures, increased flow rates of growth species, and decreased flow rates of growth species compared to comparable growth temperatures, growth pressures, and flow rates; growing the region adjacent a junction of the gate region and the drift region under nonoptimum growth conditions for a sublimation epitaxy process, wherein the nonoptimum growth conditions comprise any of a difference in a temperature gradient and a spacing between a source region and a substrate of the device compared to a comparable temperature gradient and spacing; growing the region adjacent a junction of the gate region and the drift region under nonoptimum growth conditions for a molecular beam epitaxy process, wherein the nonoptimum growth conditions for molecular beam epitaxy comprise any of a difference in a choice of seed gas, a difference in a ratio of gases in the molecular beam, and differences in temperatures for growth compared to a comparable seed gas, ratio of gases, and temperatures for growth; implementing a nonoptimum growth process of silicon carbide in the region adjacent a junction of the gate region and the drift region; and irradiating the region adjacent a junction of the gate region and the drift region with any of protons and electrons.

The regions in which the mobility and lifetime reduction occur in an embodiment of the invention are in the anode region, the gated base region, and a portion of the drift region near the gated base region. Furthermore, an embodiment of the invention provides a GTO thyristor which operates in a similar manner as conventional silicon carbide GTO thyristors, only with better performance.

The embodiments of the invention achieve several advantages. For example, the upper epilayers of an asymmetric GTO thyristor provided by the invention have their mobilities and free carrier Shockley Read Hall (SRH) lifetimes reduced. This is achieved by altering the growth techniques of the epilayers. According to an embodiment of the invention, rougher surfaces of epilayers are demonstrated to be beneficial in that it leads to lower mobilities and lifetimes in the upper regions where the critical free carrier interactions with potential barriers occur to bring about the turn-off process in GTO thyristors. An embodiment of the invention also achieves a higher turn-off gain for silicon carbide GTO thyristors than has previously been possible. This makes it possible to reduce the requirements on the gate drive circuit by using low power devices in the gate drive circuit. Moreover, because low power devices are relatively inexpensive, the GTO thyristors of the invention are less expensive to produce compared to conventional devices. As such, the devices provided by the invention are less expensive to run because higher turn-off gain means that the gate-drive circuit handles less current.

Additionally, the cooling requirements are less for the gate drive circuit if the thyristor has a higher turn-off gain because less current must be handled by the gate drive circuit leading to less heating of the elements in the gate drive circuit. Furthermore, the silicon carbide GTO thyristors according to the embodiments of the invention have overall higher power handling capability, with greater reliability compared to conventional devices, because fewer parts of the circuits of the invention are exposed to very high powers.

BRIEF DESCRIPTION OF THE DRAWINGS

The invention will be better understood from the following detailed description of a preferred embodiment(s) of the invention with reference to the drawings, in which.

DETAILED DESCRIPTION OF PREFERRED EMBODIMENTS OF THE INVENTION

Figure 1:
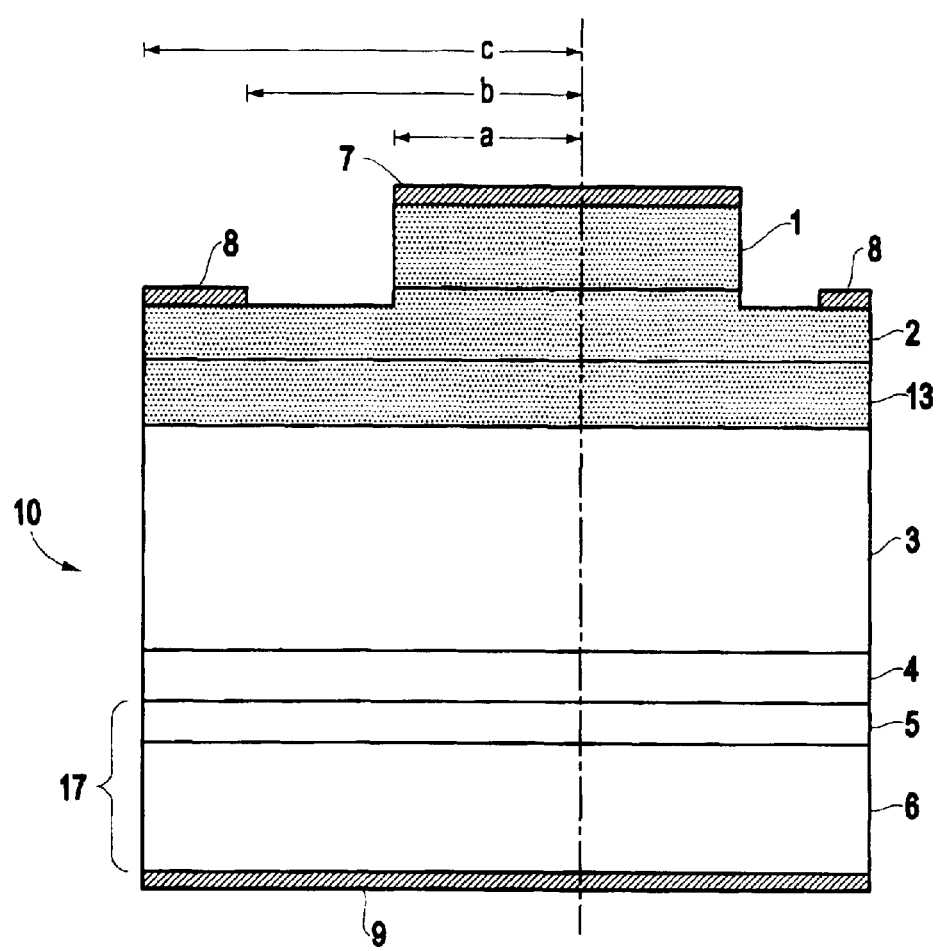
FIG. 1 is a schematic diagram of a silicon carbide GTO thyristor according to an embodiment of the invention.

As previously mentioned, there is a need for a novel silicon carbide GTO thyristor, which overcomes the deficiencies of the conventional devices and a technique for improving the turn-off gain in a thyristor. Referring now to the drawings, and more particularly to FIGS. 1 through 6, there are shown preferred embodiments of the present invention. An embodiment of the invention provides an asymmetric silicon carbide GTO thyristor in which the upper epilayers have their mobilities and free carrier SRH lifetimes reduced by a method which will effect these changes.

An embodiment of the invention provides a silicon carbide GTO thyristor, which is capable of handling higher voltages and operates over a wide temperature range along with high turn-off gains. Because of the electronic and physical characteristics of silicon carbide, the thyristor of the invention is made of silicon carbide, which provides improved on-resistance and high temperature performance over conventional thyristors made of silicon.

Moreover, because of their higher doping levels allowed for a given voltage in silicon carbide, the silicon carbide thyristor, provided by an embodiment of the invention, has a thinner drift layer and a much lower on-resistance than silicon or gallium arsenide thyristors of equivalent size, or much smaller thyristors for the same on-resistance. The high electric breakdown field, the high saturated electron drift velocity, and the high thermal conductivity offer further physical and electronic advantages in the silicon carbide thyristor provided by the invention. Moreover, the ability to operate at high power levels and high temperatures, for example, greatly reduces the weight of space-based electronic cooling systems required for semiconductor devices, and the radiation hardness of silicon carbide enhances its attractiveness for several types of applications.

FIG. 1 shows a structure according to an embodiment of the invention representing one finger of a multi-finger silicon carbide GTO thyristor structure that can be formed by repeating this structure laterally (from left to right). The silicon carbide regions, shown as elements 1, 2, 3, 4, 5, and 6 from the top to bottom of FIG. 1, form a p-n-p-p-n structure. Specifically, the GTO thyristor device 10 comprises an anode region 1, a gated base region 2, a cathode region 17, a drift region 3, wherein region 13 represents the upper portion 13 of drift region 3, and a p buffer region 4. Regions 1, 2, and 13 comprise that portion of the silicon carbide material that is adapted such that the free carrier lifetime and mobility are reduced. Furthermore, the device 10 further comprises a plurality of metal contacts including an anode contact 7, a gate contact 8, and a cathode contact 9. Additionally, the device 10 comprises a substrate 6 having several buffer layers 4 and 5 disposed thereon, wherein layers 5 and 6 collectively form the cathode 17 of the device. As an example, the device 10 may be dimensioned to be 3.0 $\mu$m as indicated by dimension a, 5.0 $\mu$m as indicated by dimension b, and 7.0 $\mu$m as indicated by dimension c.

With regard to the aforementioned p-n-p-p-n sequence, n-type and p-type refer to the majority charge carriers that are present in the region. In an n-type region, "electrons" are the majority carriers, and in a p-type region, "holes", or the absence of electrons, are the majority carriers. To make a region n-type, additional nitrogen or phosphorus atom impurities (donors, $N_D$) are typically added to the silicon carbide crystal. To make a region p-type, aluminum or boron impurities (acceptors, $N_A$) are typically added to the silicon carbide crystal.

A method of increasing the turn-off gain in a silicon carbide gate turn-off thyristor device is provided by the invention, wherein the method comprises reducing the free carrier lifetime and electron and hole mobilities in the region adjacent a junction of the gate and drift region in the device. Furthermore, the invention provides several embodiments of methods for reducing the free carrier lifetime and mobility. For example, the reduction can occur by implanting impurities that exhibit deep levels in the energy gap of the silicon carbide in the regions immediately above and immediately below the grated base/drift region junction as well as into a small portion of the drift region near this junction.

Also, creating lattice damage such as vacancies causes the reduction in the free carrier lifetime and mobility, which may occur by bombarding the regions immediately above and immediately below the gated base/drift region junction as well as into a small portion of the drift region near this junction with high energy particles.

Additionally, the reduction in the free carrier lifetime and mobility may occur by conducting an axis growth at temperatures preferably below approximately 1600° C. (6H—SiC) for a chemical vapor deposition growth of the regions immediately above and immediately below the gated base/drift region junction as well as a small portion of the drift region near this junction. Similarly, the reduction in the free carrier lifetime and mobility may occur by growing the regions immediately above and immediately below the gated base/drift region as well as a small portion of the drift region near this junction at an angle to the drift region, which forms an off axis structure. This growth is preferably carried out at temperatures below approximately 1300° C. (6H—SiC) for chemical vapor deposition (CVD) growth.

For the regions immediately above and immediately below the gated base/drift region junction, as well as a small portion of the drift region near the junction, a growth angle may be chosen at least one degree below the ideal growth angle for off axis growth at a particular temperature, which will also effectuate the reduction in the free carrier lifetime and mobility.

Moreover, the regions immediately above and immediately below the gated base/drift junction region as well as a small portion of the drift region near this junction may be grown in a horizontal-hot-wall reactor preferably at temperatures below approximately 1500° C. Additionally, the thyristor structure may be removed from the growth reactor after the drift region is grown, and then returned to the growth reactor to grow the final few microns of the drift region and the gated base and upper emitter regions. This contaminates the surface, leading to lower lifetimes and mobilities in the regions subsequently grown on this region.

In another embodiment, the regions immediately above and immediately below the gated base/drift region junction can be produced as low mobility and low lifetime regions, and the SiC regions immediately above and immediately below the gated base/drift region junction as well as the emitter region closest to this junction are made as low mobility and low lifetime regions.

Another embodiment of reducing the free carrier lifetime and mobility includes implanting the gate and anode in the thyristor device, and leaving the gate and the anode in an unannealed state, whereby implanting the gate and anode regions, or alternatively, only implanting the gate region, and refraining from annealing all of the "damage" caused by the implantation process creates low mobility and low lifetime regions. The gate is an n-type region so it could be implanted with n-type dopants such as nitrogen atoms. The anode is a p-type region and typically p-type silicon carbide is formed by implanting aluminum atoms, although boron atoms may also be used. Additionally, other atoms may be selected as good p or n type dopants as the field of art continues to progress.

The reduction in the free carrier lifetime and mobility may occur if the regions immediately above and immediately below the gated base/drift region junction as well as a small part of the drift region near this junction are formed with a semiconductor material that has a different lattice constant than the lattice constant in other areas of the drift region, so long as the semiconductor material is able to form an epitaxial growth on the silicon carbide material used for the rest of the drift region. This new semiconductor material acquires stresses that forces its energy gap to be similar to the silicon carbide on which it is grown, but its mobility and lifetime are different.

Also, if pulsed doping is used during the growth of the regions immediately above and immediately below the gated base/drift region junction as well as a small portion of the drift region near this junction, then periodically during the interval of the pulsed doping process in these layers, the dopant gas concentration can be greatly changed in the pulse so as to introduce defects in the epitaxial layer being grown thereby effectuating a reduction in the free carrier lifetime and mobility.

Moreover, by using dopants different from those used in the rest of the thyristor device, the regions immediately above and immediately below the gated base/drift region junction as well as a small portion of the drift region near this junction will produce a region of lower mobility because of increased impurity scattering.

Using nonoptimum growth conditions for vapor phase epitaxy when growing the regions immediately above and immediately below the gated base/drift region junction as well as a small portion of the drift region near this junction will produce lower lifetime and mobility for these regions. Included in nonoptimum growth conditions are lower temperatures, lower growth pressures, and non-optimum flow rates of the growth species compared to comparable growth conditions.

Similarly, using nonoptimum growth conditions for sublimation epitaxy when growing the regions immediately above and immediately below the gated base/drift region junction as well as a small portion of the drift region near this junction can produce lower lifetime and lower mobility for these regions. Included in these nonoptimum growth conditions are a nonoptimal temperature gradient and a nonoptimal spacing between source and substrate compared to comparable growth conditions.

Also, using nonoptimum growth conditions for molecular beam epitaxy when growing the regions immediately above and immediately below the gated base/drift region junction as well as a small portion of the drift region near this junction can produce lower lifetime and lower mobility for these regions.

Furthermore, using nonoptimum growth conditions for supersonic molecular beam epitaxy when growing the regions immediately above and immediately below the gated base/drift region junction as well as a small portion of the drift region near this junction can produce lower lifetime and lower mobility for these regions. Among these nonoptimum growth conditions are nonoptimal choice of seed gas, nonoptimum ratios of gases in the beam, and nonoptimum temperatures in the system compared to comparable growth conditions.

Additionally, using nonoptimum growth precursors that lead to nonoptimal growth of the silicon carbide in the regions immediately above and immediately below the gated base/drift region junction as well as a small portion of the drift region near this junction can produce lower lifetime and lower mobility for these regions.

Another embodiment of reducing the free carrier lifetime and mobility includes irradiating the GTO thyristor with protons such that the regions immediately above and immediately below the gated base/drift region junction as well as a small portion of the drift region near this junction have a reduced lifetime. Similarly, the GTO thyristor can be irradiated with electrons such that the regions immediately above and immediately below the gated base/drift region junction as well as a small portion of the drift region near this junction have a reduced lifetime.

The thyristor 10 provided by an embodiment of the invention is operated in a similar manner as conventional silicon carbide GTO thyristors. In operation, the thyristor 10 is turned on by applying a short current pulse across the gate contact 8 and the cathode contact 9. This current pulse forward biases the anode-gate and drift-gate p-n junctions and causes electrons to diffuse across to the gate region 2. The thyristor 10 is turned off by reverse biasing the gate 2 with respect to the anode 1.

Figure 2:
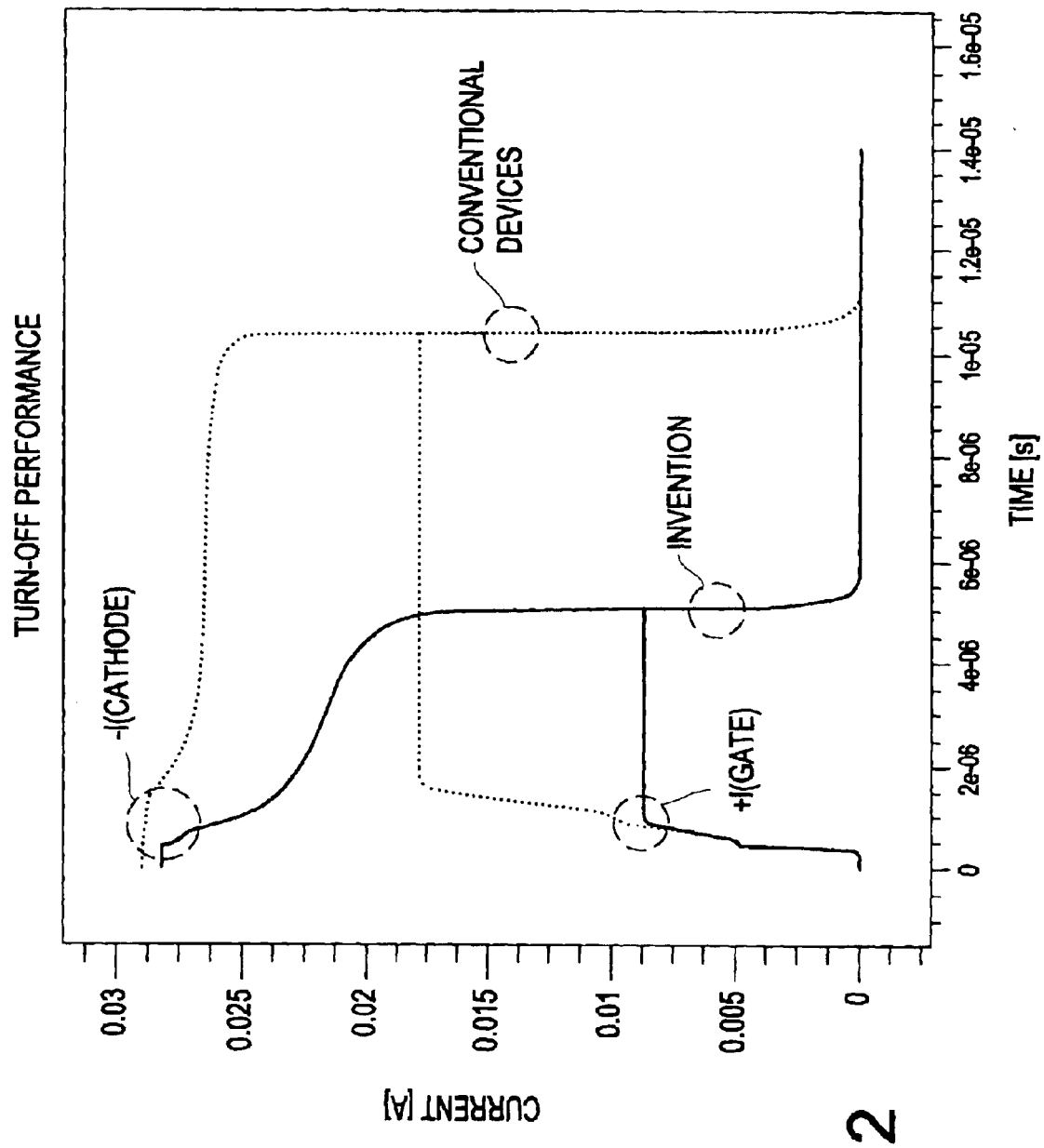
FIG. 2 is a graphical representation comparing the turn-off characteristics of an embodiment of the invention with that of a conventional device.
Figure 5B:
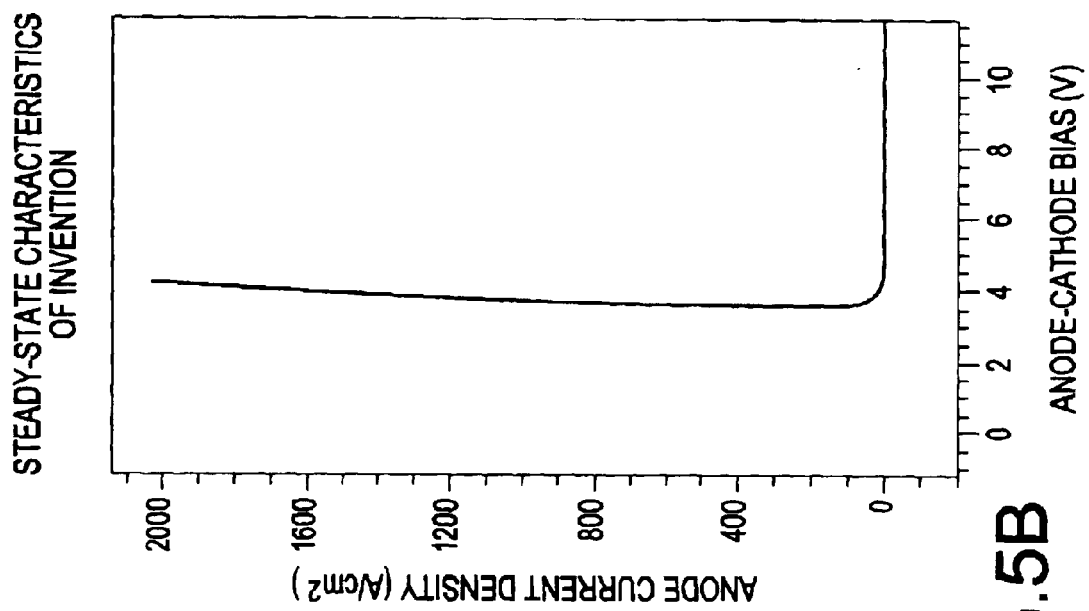
FIG. 5B is a graphical representation of the steady state characteristics of an embodiment of the invention.
Figure 5A:
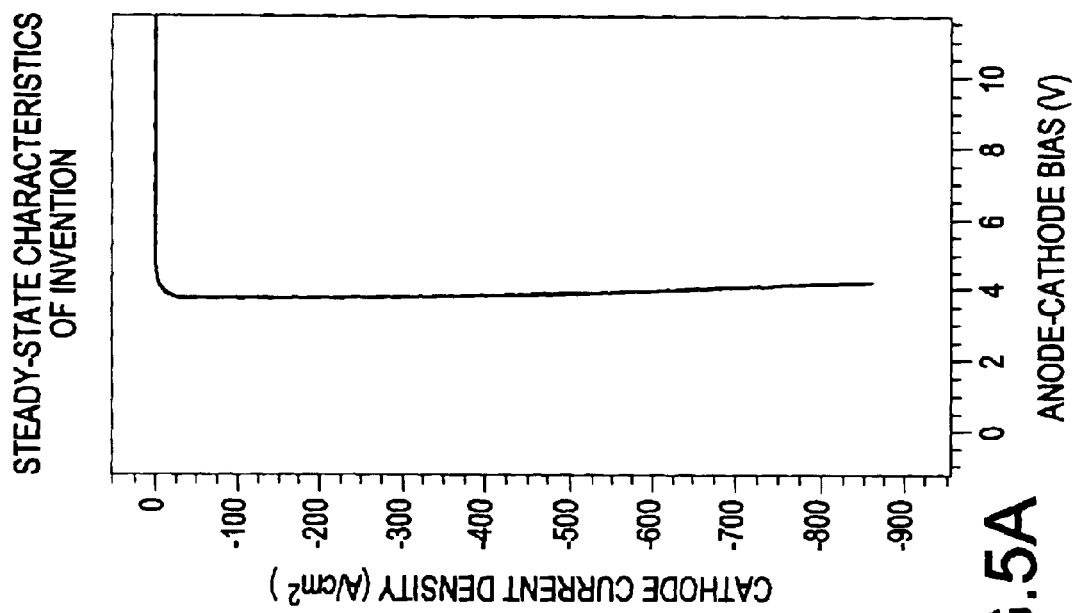
FIG. 5A is a graphical representation of the steady state characteristics of an embodiment of the invention.

The turn-off characteristic of the device according to an embodiment of the invention is graphically demonstrated in FIG. 2, which indicates that with the reduction of mobility and free carrier lifetimes in the upper regions (anode region 1, gate region 2, and upper portion 13 of the drift region 3), the turn-off gain is 3.24, compared to a turn-off gain of 1.61 in a conventional structure. As indicated, the plots demonstrate the switching waveforms of the invention (solid line) and a conventional device (dotted line). Moreover, the invention has an improved quasi-static turn-off gain as illustrated by the plot. The current switch off corresponds to a cathode current density of 400 A/cm$^2$. For these numerical simulations, the material parameters listed in Tables 1 and 2 are used.

current at its maximum level is achieved. Therefore, the modifications provided by the embodiments of the invention offer improved device performance characteristics compared to conventional devices. FIGS. 5A and 5B show steady state characteristics of a SiC GTO thyristor 10 provided by an embodiment of the invention, where FIG. 5A shows the cathode current when the device is in the on-state ($V_{A-k}$<4 V), and FIG. 5B shows the anode current when the device is in the on-state state ($V_{A-k}$<4 V). Here the anode width is preferably 3 microns and the cathode width is

TABLE 1

Material parameters used in the invention

| Region | Type | Dopant Concentration | Thickness | $\mu_n{}^a$ | $\mu_p{}^b$ | SRH$^c$ |
|---|---|---|---|---|---|---|
| 1 | P | $N_A = 2 \times 10^{19}$ cm$^{-3}$ | 0.5 μm | 25 cm$^2$/V/s | 20 cm$^2$/V/s | 10 ns |
| 2 | N | $N_D = 2.5 \times 10^{17}$ cm$^{-3}$ | 1.25 μm | 25 cm$^2$/V/s | 20 cm$^2$/V/s | 10 ns |
| 3 (shaded portion 13) | P | $N_A = 1 \times 10^{15}$ cm$^{-3}$ | 1.0 μm | 25 cm$^2$/V/s | 20 cm$^2$/V/s | 10 ns |
| 3 (unshaded portion) | P | $N_A = 1 \times 10^{15}$ cm$^{-3}$ | 14.0 μm | 618 cm$^2$/V/s | 84 cm$^2$/V/s | 200 ns |
| 4 | P | $N_A = 5 \times 10^{18}$ cm$^{-3}$ | 2.0 μm | 84 cm$^2$/V/s | 57 cm$^2$/V/s | 200 ns |
| 5 | N | $N_D = 1 \times 10^{18}$ cm$^{-3}$ | 0.5 μm | 185 cm$^2$/V/s | 66 cm$^2$/V/s | 200 ns |
| 6 | N | $N_D = 2 \times 10^{18}$ cm$^{-3}$ | substrate | 136 cm$^2$/V/s | 63 cm$^2$/V/s | 200 ns |

$^a$electron mobility,
$^b$hole mobility,
$^c$Shockley Read Hall lifetime

TABLE 2

Material parameters used in conventional devices

| Region | Type | Dopant Concentration | Thickness | $\mu_n$ | $\mu_p$ | SRH lifetime |
|---|---|---|---|---|---|---|
| 1 | P | $N_A = 2 \times 10^{19}$ cm$^{-3}$ | 0.5 μm | 51 cm$^2$/V/s | 48 cm$^2$/V/s | 200 ns |
| 2 | N | $N_D = 2.5 \times 10^{17}$ cm$^{-3}$ | 1.25 μm | 300 cm$^2$/V/s | 72 cm$^2$/V/s | 200 ns |
| 3 | P | $N_A = 1 \times 10^{15}$ cm$^{-3}$ | 15.0 μm | 618 cm$^2$/V/s | 84 cm$^2$/V/s | 200 ns |
| 4 | P | $N_A = 5 \times 10^{18}$ cm$^{-3}$ | 2.0 μm | 84 cm$^2$/V/s | 57 cm$^2$/V/s | 200 ns |
| 5 | N | $N_D = 1 \times 10^{18}$ cm$^{-3}$ | 0.5 μm | 185 cm$^2$/V/s | 66 cm$^2$/V/s | 200 ns |
| 6 | N | $N_D = 2 \times 10^{18}$ cm$^{-3}$ | substrate | 136 cm$^2$/V/s | 63 cm$^2$/V/s | 200 ns |

Figure 3B:
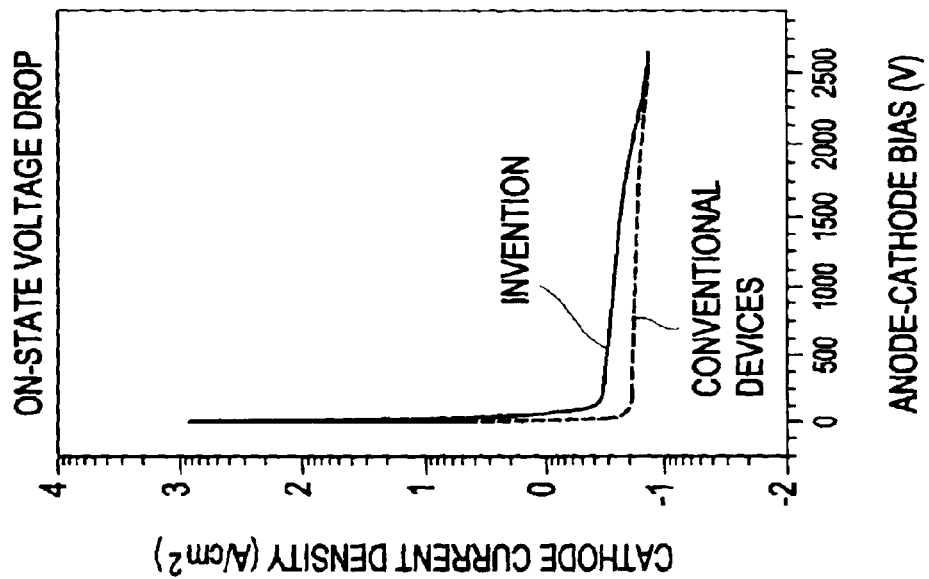
FIG. 3B is a graphical representation comparing the steady state characteristics of an embodiment of the invention with that of a conventional device.
Figure 3A:
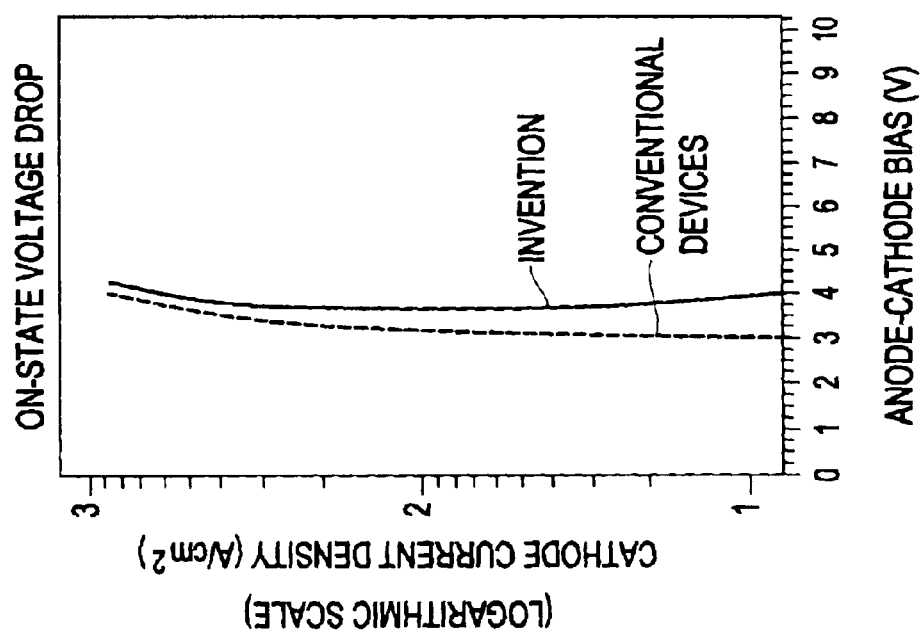
FIG. 3A is a graphical representation comparing the steady state characteristics of an embodiment of the invention with that of a conventional device.

Comparing the parameters of the invention with parameters of a conventional device, it is seen that the free carrier lifetime in the upper regions (anode region 1, gate region 2, and upper portion 13 of the drift region 3) of the GTO thyristor 10 is significantly reduced in the invention by a magnitude of approximately 20 compared to the conventional devices. Similarly, the electron and hole mobilities are also reduced in the invention. FIGS. 3A and 3B compare the steady state characteristics of a silicon carbide GTO thyristor 10 provided by an embodiment of the invention and compares it to that of conventional GTO thyristors. These curves demonstrate that the on-state voltage drop and the maximum voltage blocked are not drastically affected by the reduced lifetime and mobility which lead to the significantly greater improvement in turn-off gain in the invention. In fact, as shown in FIGS. 3A and 3B, the on-state voltage drop of the thyristor provided by an embodiment of the invention has increased only slightly compared to the conventional device, from 3.55 V to 3.85 V at 500 A/cm$^2$. Again, these figures indicate that the reduced lifetimes and mobility do not detrimentally affect the on-state characteristics or the maximum voltage blocked.

Figure 4:
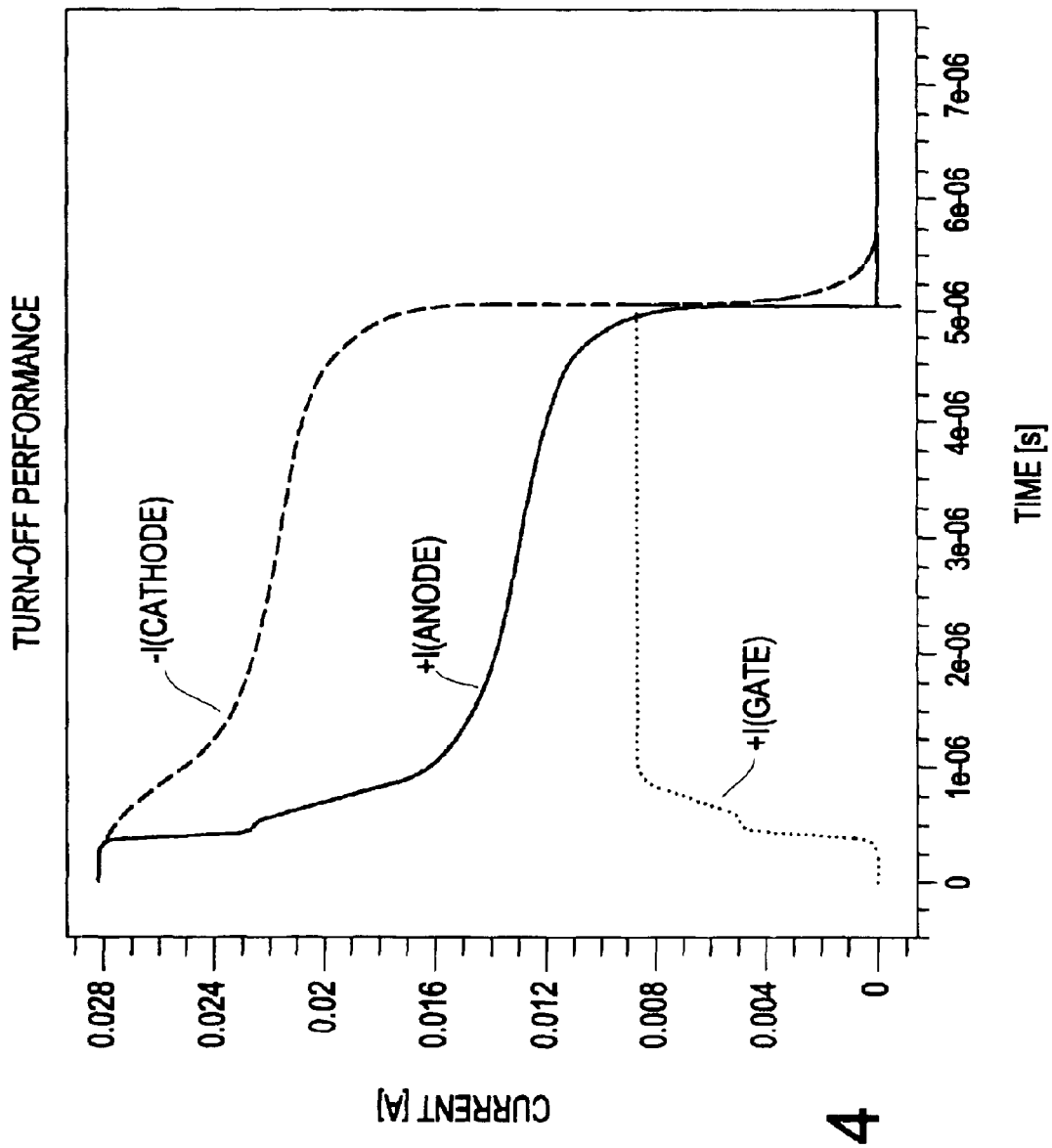
FIG. 4 is a graphical representation of the turn-off characteristics of an embodiment of the invention.

Next, FIG. 4 specifically details the turn-off characteristics of the invention showing plots of the anode current, gate current, and cathode current, respectively. FIG. 4 indicates that the embodiments of the invention improve the GTO thyristor turn-off gain because the slow reduction in the anode current, as indicated in the graph, with a constant gate preferably 7 microns. Moreover the gate current density is 0.5 A/cm$^2$. FIGS. 5A and 5B essentially indicate that over a good range of current densities for the anode contact or cathode contact, the device 10 exhibits improved characteristics over the conventional devices. Furthermore, lowering the free carrier lifetimes or mobilities does not adversely affect the anode or cathode current density.

Figure 6:
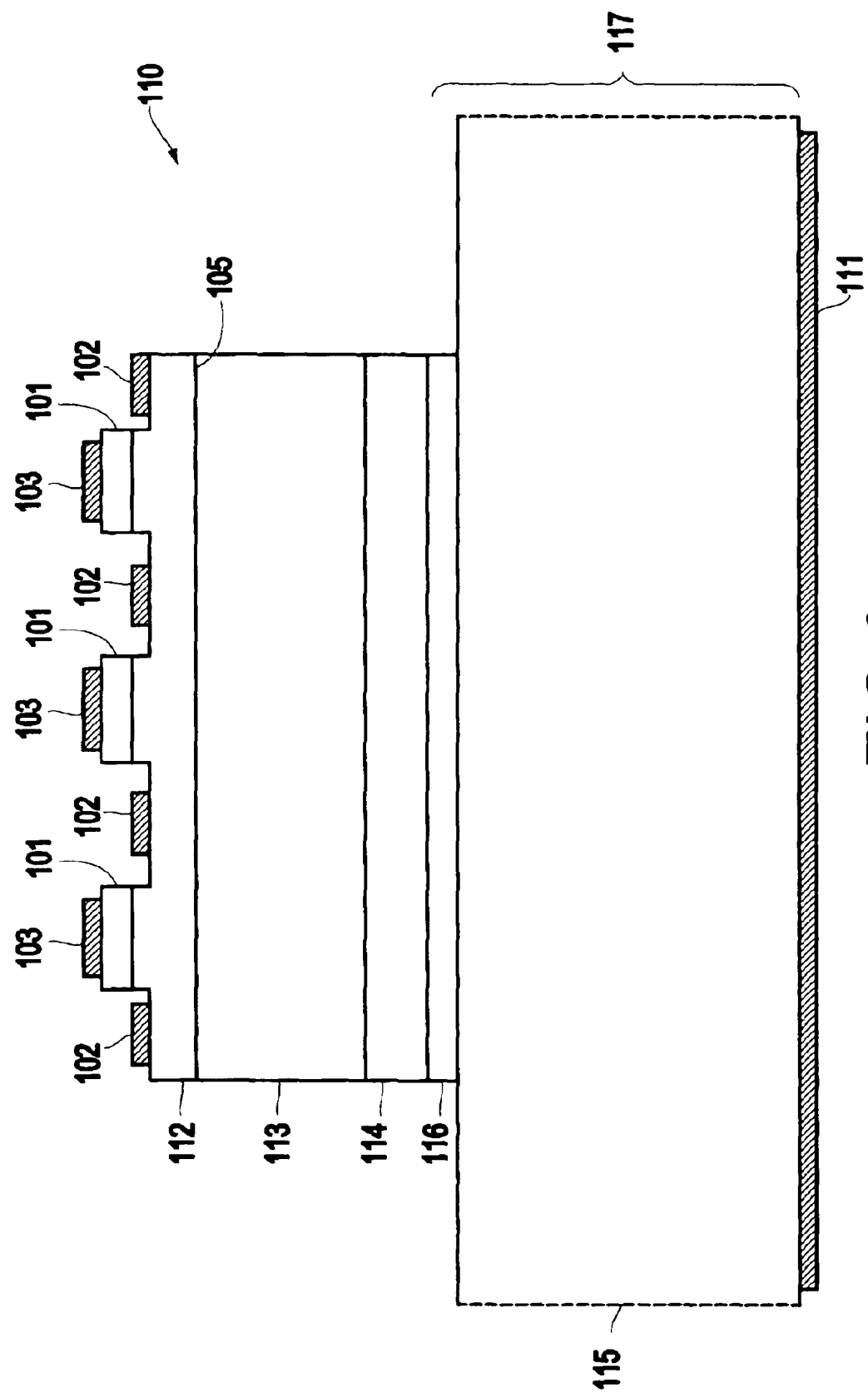
FIG. 6 is a schematic diagram of a silicon carbide GTO thyristor according to an alternative embodiment of the invention.

FIG. 6 shows an alternative embodiment of a silicon carbide GTO thyristor 110 according to the invention. As shown in FIG. 6, the silicon carbide thyristor 110 comprises a substrate 115, an anode 101, a drift region 113, a gate 112, and a cathode 117 (collectively elements 115 and 116). The substrate 115, the anode 101, and drift region 113, the gate 112, and the cathode 117 are each preferably formed of silicon carbide having a polytype comprising any one of 3C, 2H, 4H, 6H, and 15R. The substrate 115 is formed of silicon carbide having one conductivity type, and the cathode 117 is formed adjacent the substrate and has the same conductivity type as the substrate 115. The silicon carbide buffer layer 114 is formed adjacent the cathode 117 and has the opposite conductivity type as the substrate 115. The drift region 113 comprising silicon carbide is formed adjacent the buffer layer 114 and has the same conductivity type as the buffer layer 114. The gate 112 is formed adjacent the drift region 113 and has an opposite conductivity type from the drift region 113. The anode 101 is formed adjacent the gate 112 and has an opposite conductivity type from the gate 112.

Furthermore, ohmic contacts 102, 103, 111 preferably comprising aluminum, aluminum-titanium alloy, platinum, platinum silicide, or nickel, are formed on the anode 101, cathode 111, and gate 112 to provide respective anode contacts 103, cathode contacts 111, and a gate electrode contact 102.

The embodiments of the invention achieve several advantages. For example, the upper epilayers of an asymmetric GTO thyristor provided by the invention have their mobilities and free carrier SRH lifetimes reduced. This is achieved by altering the growth techniques of the epilayers. According to an embodiment of the invention, rougher surfaces of epilayers are demonstrated to be beneficial in that it leads to lower mobilities and lifetimes in the upper regions where the critical free carrier interactions with potential barriers occur to bring about the turn-off process in GTO thyristors. An embodiment of the invention also achieves a higher turn-off gain for silicon carbide GTO thyristors than has previously been possible. This makes it possible to reduce the requirements on the gate drive circuit by using low power devices in the gate drive circuit. Moreover, because low power devices are relatively inexpensive, the GTO thyristors of the invention are less expensive to produce compared to conventional devices. As such, the devices provided by the invention are less expensive to run because higher turn-off gain means that the gate-drive circuit handles less current.

Additionally, the cooling requirements are less for the gate drive circuit if the thyristor has a higher turn-off gain because less current must be handled by the gate drive circuit leading to less heating of the elements in the gate drive circuit. Additionally, the silicon carbide GTO thyristors according to the embodiments of the invention have overall higher power handling capability, with greater reliability compared to conventional devices, because fewer parts of the circuits of the invention are exposed to very high powers.

The invention provides better switching performance then for any other known high temperature, high power semiconductor switch in power conversion systems such as inverter circuits and converter circuits for use in traction applications and the like. The thyristors of the invention handle much higher voltages and currents than other comparable devices, such as an insulated gate bipolar transistor.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A silicon carbide (SiC) gate turn-off (GTO) thyristor device, said device comprising:
   a cathode region;
   a drift region positioned over said cathode region;
   a gate region positioned over said drift region;
   an anode region positioned over said gate region; and
   at least one contact positioned adjacent each of said gate region, said anode region, and said cathode region;
   wherein said anode region, said gate region, and said drift region comprise an upper region of said device, and
   wherein said upper region has a free carrier lifetime of approximately 10 nanoseconds.

2. A silicon carbide (SiC) gate turn-off (GTO) thyristor device, said device comprising:
   a cathode region;
   a drift region positioned over said cathode region;
   a gate region positioned over said drift region;
   an anode region positioned over said gate region; and
   at least one contact positioned adjacent each of said gate region, said anode region, and said cathode region;
   wherein said anode region, said gate region, and said drift region comprise an upper region of said device, and
   wherein said upper region has an electron mobility of approximately 25 $cm^2/V/s$ and a hole mobility.

3. A silicon carbide (SiC) gate turn-off (GTO) thyristor device, said device comprising:
   a cathode region;
   a drift region positioned over said cathode region;
   a gate region positioned over said drift region;
   an anode region positioned over said gate region; and
   at least one contact positioned adjacent each of said gate region, said anode region, and said cathode region;
   wherein said anode region, said gate region, and said drift region comprise an upper region of said device, and
   wherein said upper region has an electron mobility and a hole mobility of approximately 20 $cm^2/V/s$.

4. A silicon carbide (SiC) gate turn-off (GTO) thyristor device, said device comprising:
   a cathode region;
   a drift region having an upper portion and a lower portion, said drift region overlying said cathode region;
   a gate region overlying said drift region;
   an anode region overlying said gate region; and
   at least one ohmic contact positioned on each of said gate region, said anode region, and said cathode region;
   wherein said upper portion of said drift region, said gate region, and said anode region have a free carrier lifetime of approximately 10 nanoseconds.

5. A silicon carbide (SiC) gate turn-off (GTO) thyristor device, said device comprising:
   a cathode region;
   a drift region having an upper portion and a lower portion, said drift region overlying said cathode region;
   a gate region overlying said drift region;
   an anode region overlying said gate region; and
   at least one ohmic contact positioned on each of said gate region, said anode region, and said cathode region;
   wherein said upper portion of said drift region, said gate region, and said anode region have an electron mobility of approximately 25 $cm^2/V/s$ and a hole mobility.

6. A silicon carbide (SiC) gate turn-off (GTO) thyristor device, said device comprising:
   a cathode region;
   a drift region having an upper portion and a lower portion, said drift region overlying said cathode region;
   a gate region overlying said drift region;
   an anode region overlying said gate region; and
   at least one ohmic contact positioned on each of said gate region, said anode region, and said cathode region;
   wherein said upper portion of said drift region, said gate region, and said anode region have an electron mobility and a hole mobility of approximately 20 $cm^2/V/s$.

* * * * *